United States Patent [19]
Yamashita

[11] Patent Number: 5,266,895
[45] Date of Patent: Nov. 30, 1993

[54] PROBE WITH CONTACT PORTION INCLUDING AU AND CU ALLOY

[75] Inventor: Satoru Yamashita, Kofu, Japan

[73] Assignee: Tokyo Electron Yamanashi Limited, Nirasaki, Japan

[21] Appl. No.: 800,001

[22] Filed: Nov. 29, 1991

[30] Foreign Application Priority Data

Nov. 30, 1990 [JP] Japan .................. 2-339803

[51] Int. Cl.⁵ .............. G01R 1/073; G01R 31/02
[52] U.S. Cl. .................. 324/158 P; 324/72.5; 324/158 F
[58] Field of Search .............. 324/158 P, 72.5, 158 F

[56] References Cited

U.S. PATENT DOCUMENTS

| | | | |
|---|---|---|---|
| 3,613,001 | 10/1971 | Hastetter | 324/158 P |
| 3,781,681 | 12/1973 | Wagner et al. | 324/158 P |
| 4,225,819 | 9/1980 | Grau et al. | 324/158 F |
| 4,574,235 | 3/1986 | Kelly et al. | 324/158 F |

*Primary Examiner*—Ernest F. Karlsen
*Attorney, Agent, or Firm*—Oblon, Spivak, McClelland, Maier & Neustadt

[57] ABSTRACT

A probe to be electrically connected to an internal circuit of a semiconductor element, comprising a contact portion to be brought into pressure contact with an electrode formed on the semiconductor element, wherein the contact portion is made of an alloy consisting of Au, Cu, and an inevitable impurity. The contact resistance between the probe and electrode is low, and is maintained low in a stable manner even if the probe is repeatedly used.

5 Claims, 7 Drawing Sheets

PROBE WITH CONTACT PORTION INCLUDING AU AND CU ALLOY

BACKGROUND OF THE INVENTION

1. Field of the Invention

This invention relates to an improved probe for use in performing a characteristic test of, for example, a semiconductor device. This probe is used in a state where it is in tight contact with an electrode pad of the device so as to be electrically connected to the internal circuit of the device.

2. Description of the Related Art

Figure 1:
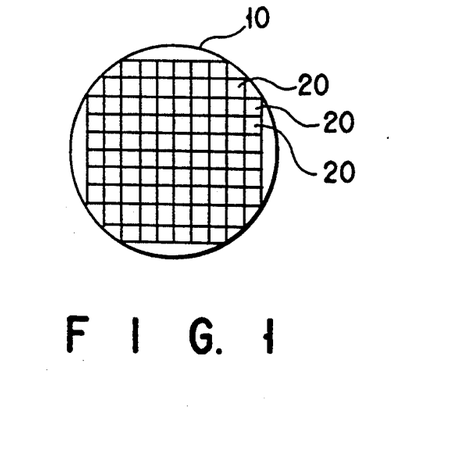
FIG. 1 is a plan view, showing a silicon wafer.

As is shown in FIG. 1, in manufacturing a semiconductor device such as an LSI, integrated circuits are formed in those chip regions 20 of a disklike silicon wafer 10, the chip regions having a size of a few mm square. The chip regions 20 are then separated from one another. Separated chips 20 are assembled into a finished product by use of a ceramic or resin package. In the case of using the resin package, they are assembled into a mountable form of e.g. DIP type after being subjected to assembling steps such as die bonding, wire bonding, and resin molding.

To minimize the degree of inferior products to be provided after the assembling process, it is necessary to test each chip 20 and to prevent inferior chips from being subjected to the assembling process. To this end, it is generally performed to test the electrical characteristics of the chip regions 20 in the wafer 10 before the regions are separated, and to give an identification mark to an inferior chip detected by the test.

Figure 2:
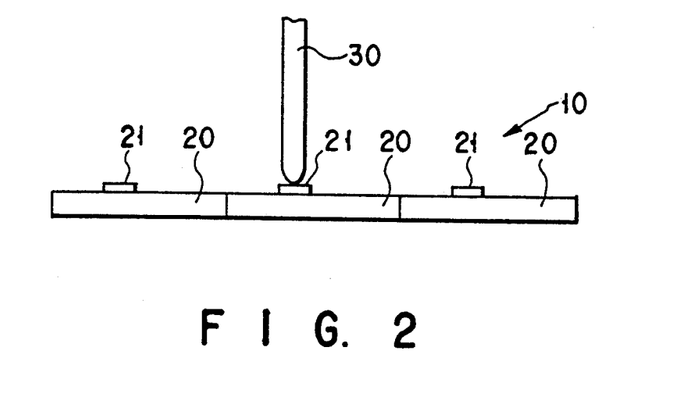
FIG. 2 is a view, useful in explaining the relationship between a probe and an object in a probe test.

For performing the above characteristic test of chip regions before terminals for a finished product are not provided to the regions, a method using a probe 30 made of a conductive material has been widely employed. In the method, for example, as is shown in FIG. 2, the tip of the probe 30 is brought into contact with a bonding pad 21 formed in each chip region 20. The base portion of the probe 30 is connected to a measuring apparatus such as an electrical signal generator or a waveform analyzer. Thus, the integrated circuits formed in the chip regions 20 are electrically connected to the measuring apparatus, which enables the characteristic test of the regions to be performed.

At least that tip portion of the above probe 30 which is to be brought into contact with an object is made of e.g. tungsten (W), a silver-palladium alloy (Ag-Pd), or a copper-beryllium alloy (Cu-Be). The material of the tip portion is determined in accordance with the material of the electrode pad.

Specifically, in order to be brought into contact to an aluminum electrode employed in a memory IC or a logic IC, a probe having a tip portion made of W is mainly used. Further, in order to be brought into contact to a gold bump electrode employed in an LCD driver IC or a CPU chip, a probe having a tip portion made of an Ag-Pd alloy is mainly used. In the case of a high-current source pin employed in a linear IC or a transistor, a probe having a tip portion made of Cu-be is mainly used.

However, it is difficult to obtain accurate characteristic test results by using the above-described probes, since a sufficiently low and stable contact resistance cannot be obtained between the probes and an object.

Specifically, a sufficiently low initial contact resistance cannot be obtained by using the probe having its tip portion made of W. Also, a sufficiently stable contact resistance cannot be obtained by using the same, and therefore the contact resistance will increase if the number of times of contact increases. On the other hand, the probe having its tip portion made of Ag-Pd or Cu-Be enables such a sufficiently low initial contact resistance to be obtained, but cannot maintain the low contact resistance in a stable manner, so that the contact resistance will increase if the number of times of contact increases.

SUMMARY OF THE INVENTION

It is an object of the invention to provide a durable probe which enables a sufficiently low contact resistance to be obtained between itself and an object to be tested, and which enables the low contact resistance to be maintained in a stable manner even if the probe is repeatedly brought into contact with the object.

The object of the invention is achieved by the probe to be electrically connected to an internal circuit of a semiconductor element, and comprises:

a contact portion to be brought into pressure contact with an electrode formed on the semiconductor element;

wherein the contact portion is made of an alloy consisting of Au, Cu, and an inevitable impurity.

The inventor studied the reason why the contact resistance of the conventional probe, which has an unstable characteristic, increases as the number of times of contact increases. As a result, he concluded that the instability is caused by adhesion of impurities, existing in the surface of the gold bump electrode or aluminum pad electrode to the tip portion of the probe. This conclusion is based upon the knowledge that particular in the case of forming the gold bump electrode, impurities, existing in the surface of a silicon chip and having low affinity to Au, migrate to the surface of an Au bump at the time of forming the Au bump or at the time of annealing performed after formation of the Au bump.

In view of the above, the inventor filed a Japanese application (Japanese Patent Application No. 004880/90) claiming a probe having an Au-plated tungsten body. However, it should be noted that the application is not applicable as prior art to the present application, since the former was not published when the Japanese patent application corresponding to the latter was filed with the Japanese Patent Office.

A sufficiently low and stable contact resistance was able to be obtained between the gold-plated probe and an object. The reason why the stability of the contact resistance could be obtained seems that impurities, which may cause an increase in contact resistance, are hard to adhere to the tip portion of an Au-plated probe.

However, the Au layer of the Au-plated probe may be removed from the tip portion thereof if the probe is repeatedly brought into contact with the electrode of a semiconductor element. If the Au layer is removed, the contact resistance of the probe may increase abruptly, and hence the durability thereof are still insufficient.

Thus, the inventor further studied the use of an Au alloy to the tip portion of the probe in order to enhance the durability without losing the advantage of the Au-plated probe. Then, he found that an alloy consisting of Au, Cu, and inevitable impurities enables the probe to have a low contact resistance identical to that of the Au-plated probe, and made the present invention. Since the probe according to the present invention has a tip portion made of such an alloy, it is free from the problem that its plating is removed.

In the present invention, the alloy forming the contact portion preferably consists of 74–76% by weight of Au, 24–26% by weight of Cu, and the remaining inevitable impurities. More preferably, the alloy consists of 75% by weight of Au, and 25% by weight of Cu. Further, the inevitable impurities comprise Ag, Ni, Fe, C, O, etc. The amount of the impurities is preferably limited to 0.01% by weight or less.

The alloy forming the probe of the present invention has a low and stable contact resistance relative to an electrode of an object, so that accurate information can be obtained in a stable manner from the object. In addition, the contact surface of the probe will be worn evenly if the probe is repeatedly used, and hence the probe is free from a shortened life due to uneven abrasion. Moreover, the alloy having the above-described preferable composition has an appropriate softness, which prevents the object from being much injured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

This invention will be explained with reference to the accompanying drawings showing embodiments thereof.

Figure 3:
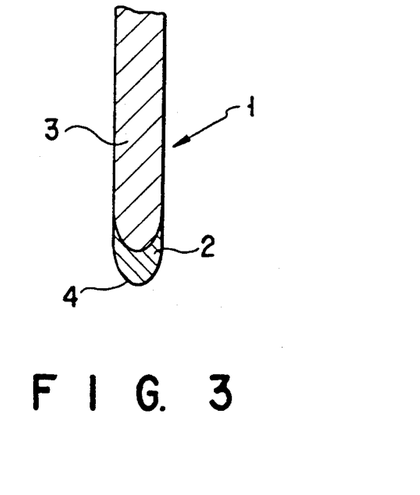
FIG. 3 is a sectional view, showing an embodiment of the invention.

FIG. 3 is a longitudinal cross sectional view, showing a probe according to an embodiment of the invention. As is shown in the figure, a probe 1 comprises a contact portion 2 provided at the tip thereof, and a support portion 3. The contact portion 2 is made of an alloy having a preferable composition, i.e., 74–76% by weight of Au, 24–26% by weight of Cu, 0–0.01% by weight of Ag, and 0–0.01% by weight of Ni. The support portion 3 is made of tungsten. The tip portion of the probe 1 is rounded. The tip portion 2 is coupled with the support portion by means of e.g. fusion bonding.

Figure 4:
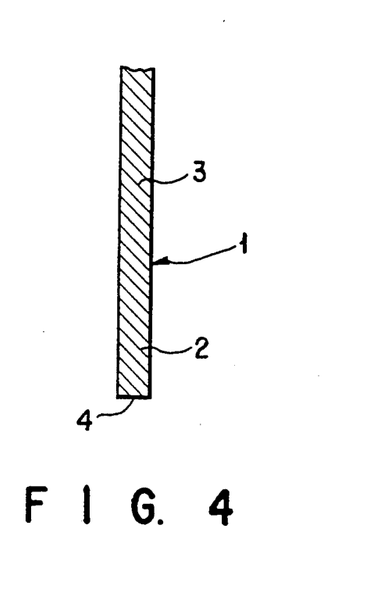
FIG. 4 is a sectional view, showing another embodiment of the invention.

FIG. 4 is a longitudinal cross section, showing a probe according to another embodiment of the invention. In this embodiment, the contact and support portions 2 and 3 are made of the same material, i.e., of the Au-Cu alloy described above. The probe 1 is a cylinder having a predetermined diameter from the support portion 3 to a flat end thereof.

The probe 1 may have a conical end or a thinner end similar to an end of a (-) screwdriver, instead of the flat end.

Further, in a case where the support portion 3 is made of a material different from that of the contact portion 2 as in the embodiment of FIG. 3, the portion 3 may be made of e.g. Cu-Be, instead of tungsten.

Figure 5A:
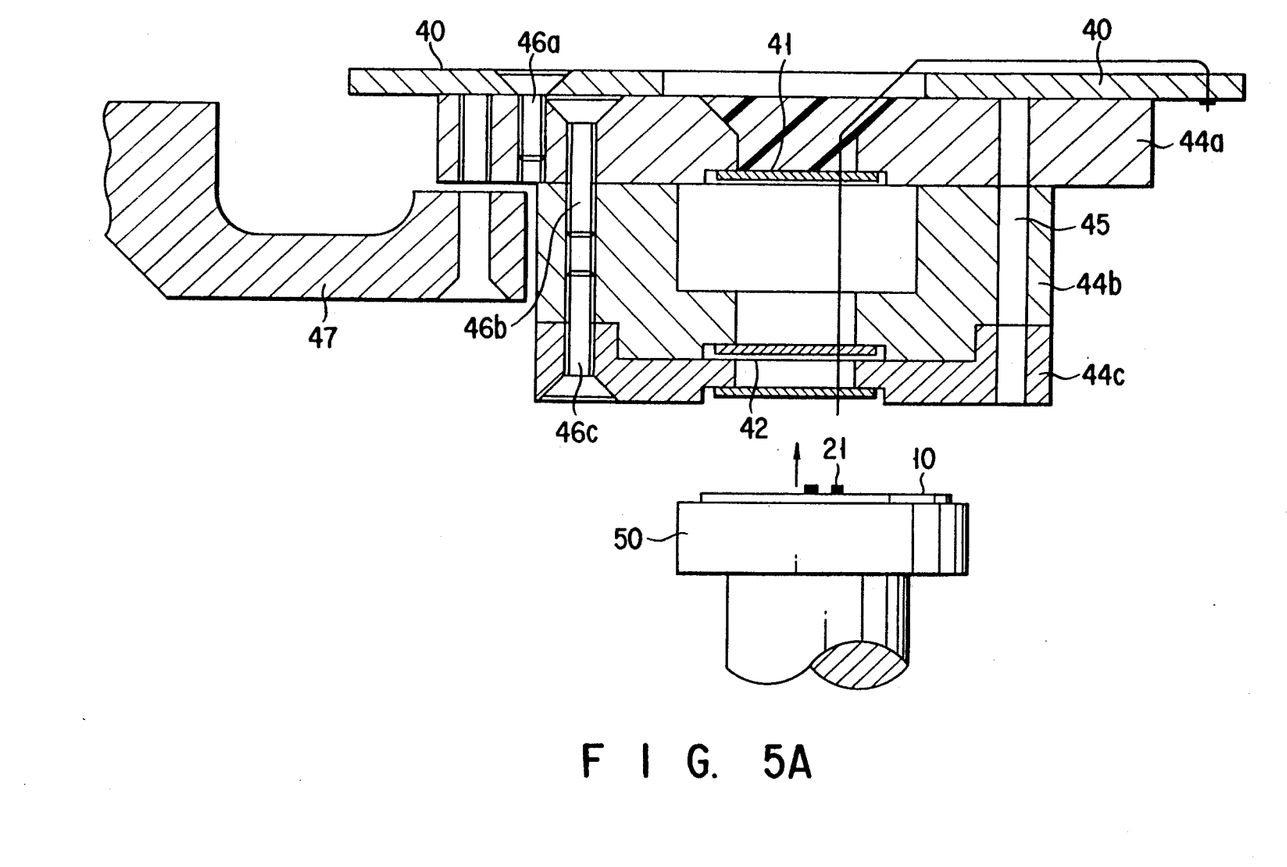
FIG. 5A is a view, showing a probe card using the probe of the invention.

As is shown in FIG. 5A, the probe according to this embodiment is suitably applied to a probe card 40. The probe card 40 is a printed circuit substrate on which probes 1 and measuring circuit elements are mounted, and is used by being mounted on a wafer prober. The probes 1 are secured to the conductor pattern of the substrate 40 by means of a solder. In this probe card, the probes 1 are provided in the vertical directions as shown in the figure, and the tip portion of each probe 1 is positioned so as to be able to touch an electrode pad 21 formed on the surface of a semiconductor wafer 10 to be tested. Reference numeral 41 denotes a plate for fixing the probe 1 in the vertical direction. The probe 1 extends in the vertical direction through the fixing plate 41, and is adhered to the fixing plate 41 by means of an adhesive or so. The tip portion of the probe extends through holes formed in guide plates 42 and 43, such that the horizontal position of the tip portion is determined. The base portion of the probe 1 is connected to a given portion of the substrate 40. The fixing plate 41 and guide plates 42 and 43 are fixed in position by a fixing mechanism (not shown) of the wafer prober. In addition, numerals 44a, 44b and 44c denote upper block, medium block and lower block respectively. Numeral 45 denotes regulation pin for positioning the blocks 44a, 44b and 44c in relation to each others. Numerals 46a, 46b and 46c denote fixing screws. Numeral 47 denotes an reinforcing ring which is connected to the upper block 44a and support probing pressure.

To perform a wafer probing test, the probe card 40 mounted on a wafer prober is used. The contact portion 2 of the probe 1 is brought into contact with the electrode pad 21 of the wafer 10 placed on a work table 50, thereby measuring the characteristics of a circuit formed in the chip. At this time, the contact portion 2 of each probe 1 is made of an Au-Cu alloy having a preferable composition, so that a sufficiently low contact resistance is obtained between the contact portion 2 and electrode pad 21. For example, if the electrode pad 21 is made of Al, the contact resistance is 0.5Ω or less, while if the pad 21 is made of Au, the resistance is 0.05Ω or less.

Figure 5B:
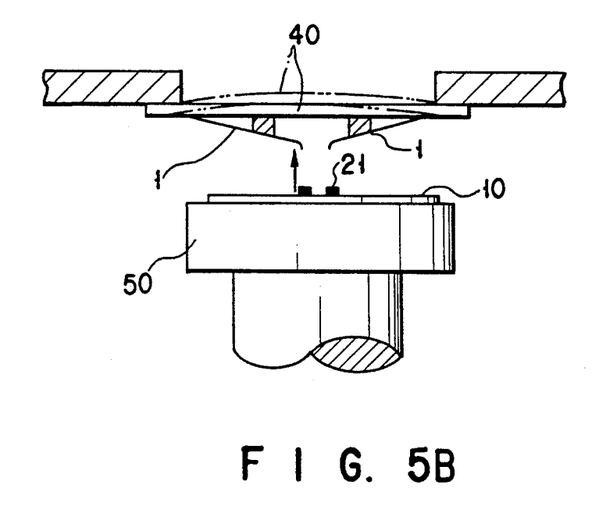
FIG. 5B is a view, showing a conventional probe card.
Figure 6A:
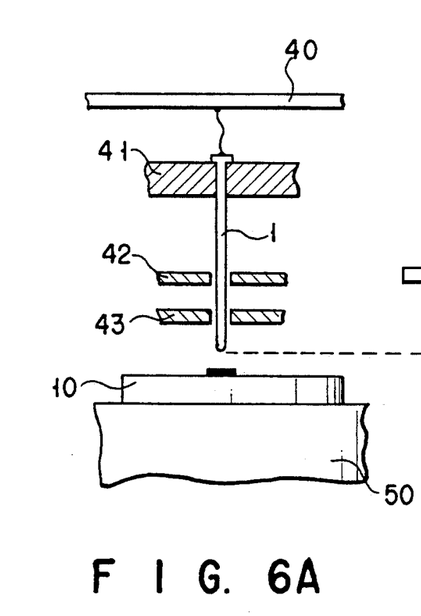
FIG. 6A and 6B are views, showing operation principle of the probe card according to FIG. 5A.

To contact the electrode pads 21 with the contact portions 2 of the probes 1, the work table 50 is moved up as indicated by the arrow in FIG. 5. At this time, to avoid insufficient contact of them, the work table 50 is further moved up, i.e., is overdriven, by a predetermined distance (O.D.) after the pads 21 are brought into contact with the probes 1, as is shown in FIGS. 6A and 6B.

Figure 6B:
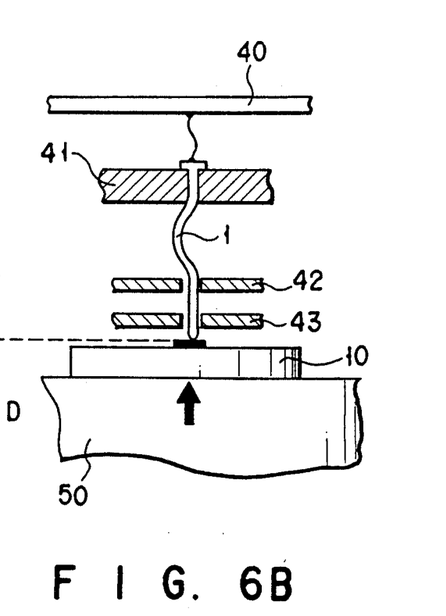

In case of performing a probe test by use of the probe card shown in FIG. 5A, when the work table 50 is brought into contact with the probe and is then overdriven, the probe 1 is deformed by buckling as shown in FIG. 6B, that is, it is electrically connected to the electrode pad in an appropriate manner as a result of the urging force of the table 50. Since the probe of the invention is relatively elastic, and hence is deformable, it is suitable for use in a vertical probe type probe card.

The vertical probe type probe card of FIG. 5A is advantageous in that a stress due to the overdrive of the table 50 is not applied to the printed circuit substrate 40. In contrast, the oblique probe type probe card of FIG. 5B, however, is deformed by overdriving as indicated by the two-dot chain line, and therefore the actual probe pressure is smaller than a predetermined value, which may result in insufficient contact. The probe card of FIG. 5A is free from this inconvenience.

The invention will be explained in more detail by using examples as below.

EXAMPLE 1

A probe and a sample wafer which have the following specifications were prepared:

Probe

Support portion 3 and Contact portion 2:
Material: an alloy containing 75% by weight of Au and 25% by weight of Cu
Shape of the tip end portion: circular cone having an apex angle of approx. 90° (diameter of the tip: 14–18 μm)

Sample wafer

Diameter: 10 cm
Electrode: an Au pad having a film thickness of 18 μm
Annealing: 350° C., 30 minutes Such a vertical probe type probe card as shown in FIG. 5A was made by use of the above probe, and a wafer probing test was performed with this probe card and the above sample wafer.

Figure 7:
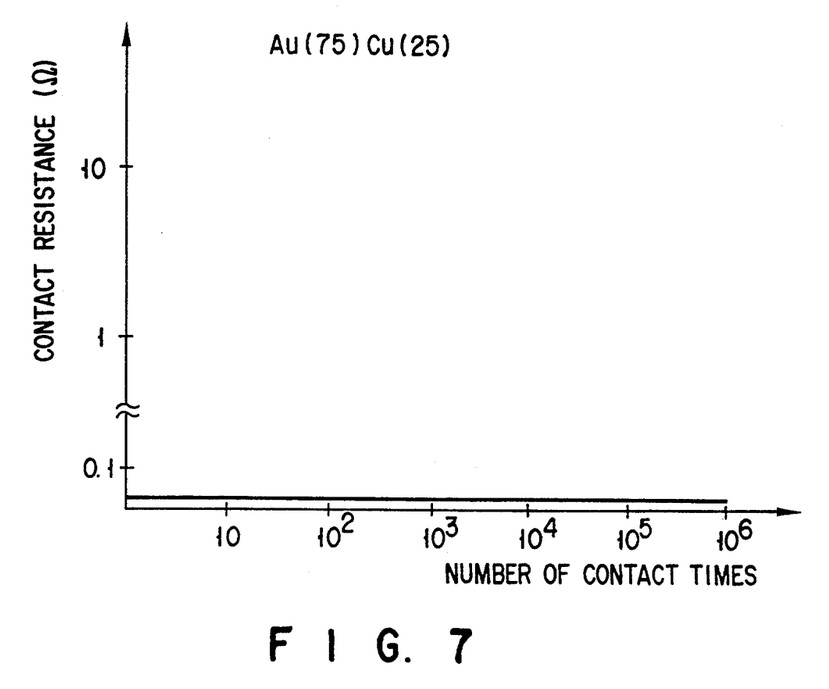
FIGS. 7–14 are graphs, showing results of a test performed for confirming the advantage of the invention.

The probe was brought into contact with the electrode $10^6$ times on a continuous basis, and variations in contact resistance were measured, which results are shown in FIG. 7.

As is evident from FIG. 7, the same low contact resistance as the initial value was obtained after the contact was performed $10^6$ times.

EXAMPLE 2

A wafer probing test was performed in the same contact manner as the above, using a probe having the same specifications as the above probe and a sample wafer as specified below.

Sample wafer

Diameter: 15 cm
Electrode: an Al pad formed on a silicon surface by sputtering using an Al target containing 1% of Si, and having a film thickness of 0.9 μm
Contact between the Al pad and probe was performed by the "Contact and Slide Probing Method", i.e., the probe was moved 10 or 20 μm relative to the pad after they were brought into contact with each other. The contact was repeated $10^6$ times, thereby obtaining variations in contact resistance. Measurement results are shown in FIG. 8.

Figure 8:
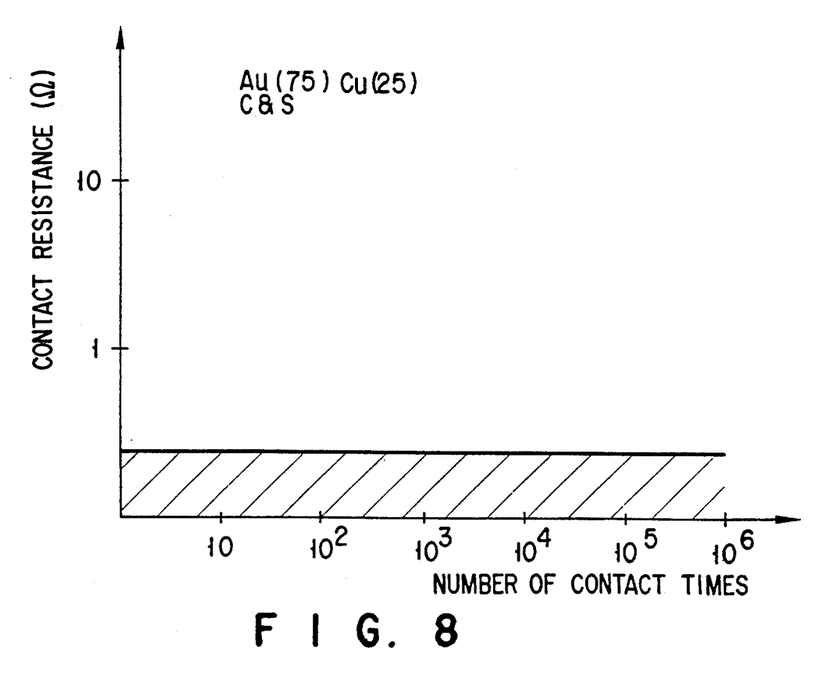

As is evident from FIG. 8, the same low contact resistance as the initial value was obtained from the probe after the contact was performed $10^6$ times.

REFERENCE EXAMPLE 1

A probe having the following specifications was prepared:
Support portion 3:
Material: Tungsten; Diameter: 70 μm
Contact portion 2:
Material: Tungsten
Shape of the tip end portion: circular cone having an apex angle of approx. 90° (diameter of the tip: 3–5 μm)

Figure 9:
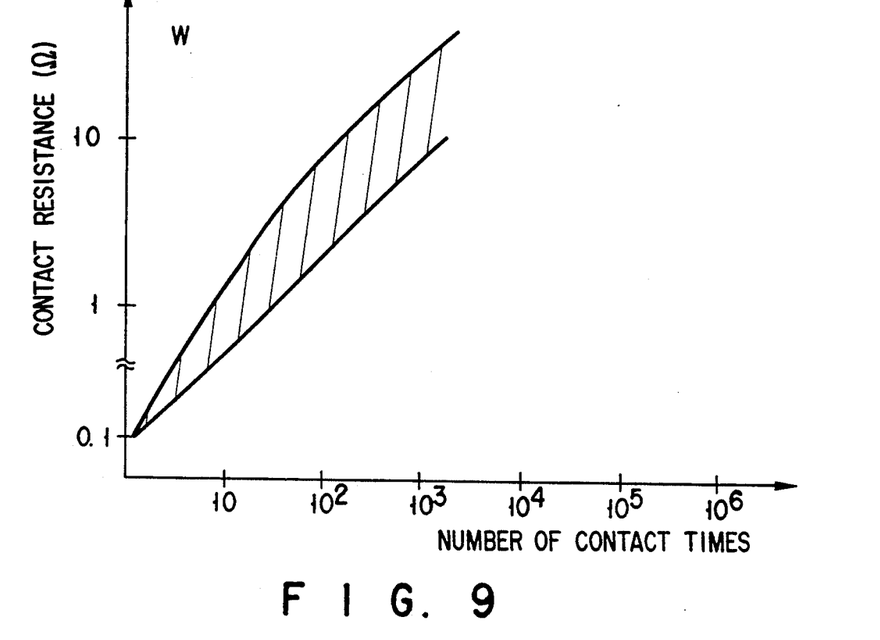

This probe was incorporated in a vertical probe type probe card as shown in FIG. 5A, and a wafer probing test was performed in the same contact manner as the above, employing the probe card and a sample wafer as used in Example 1. FIG. 9 shows measurement results.

As is seen from FIG. 9, the contact resistance of the probe conspicuously increased as the number of times the contact was performed increased.

REFERENCE EXAMPLE 2

A wafer probing test was performed in the same manner as above, employing a probe as used in Reference Example 1 and a wafer sample as used in Example 2. Measurement results are shown in FIG. 10.

Figure 10:
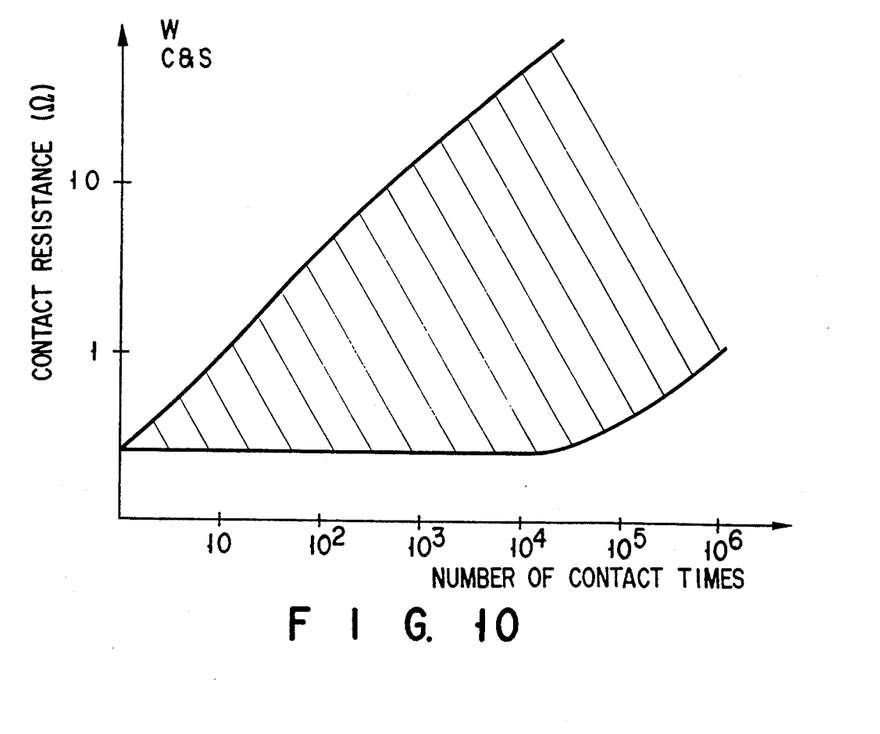

As is evident from FIG. 10, the contact resistance of the probe conspicuously increased as the number of times the contact was performed increased.

REFERENCE EXAMPLE 3

A probe having the following specifications was prepared:
Support portion 3:
Material: BeCu; Diameter: 70 μm
Contact portion 2:
Material: BeCu
Shape of the tip end portion: circular cone having an apex angle of approx. 90° (diameter of the tip: 14–18 μm)

Figure 11:
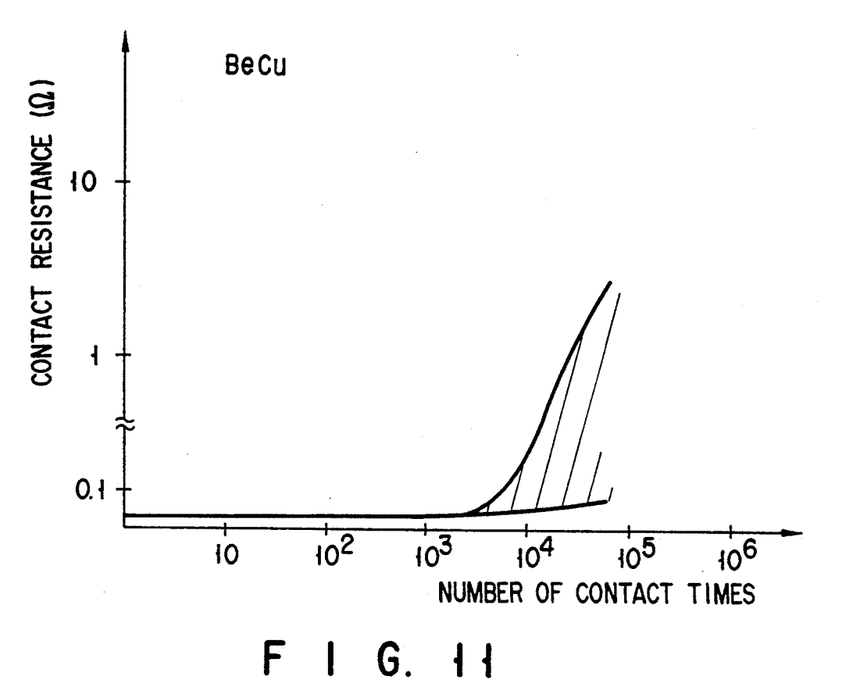

This probe was incorporated in a vertical probe type probe card as shown in FIG. 5A and a wafer probing test was performed in the same contact manner as the above, employing the probe card and a sample wafer as used in Example 1. FIG. 11 shows measurement results.

As is seen from FIG. 11, the contact resistance of the probe conspicuously increased after the contact was repeated $10^3$–$10^4$ times.

REFERENCE EXAMPLE 4

Figure 12:
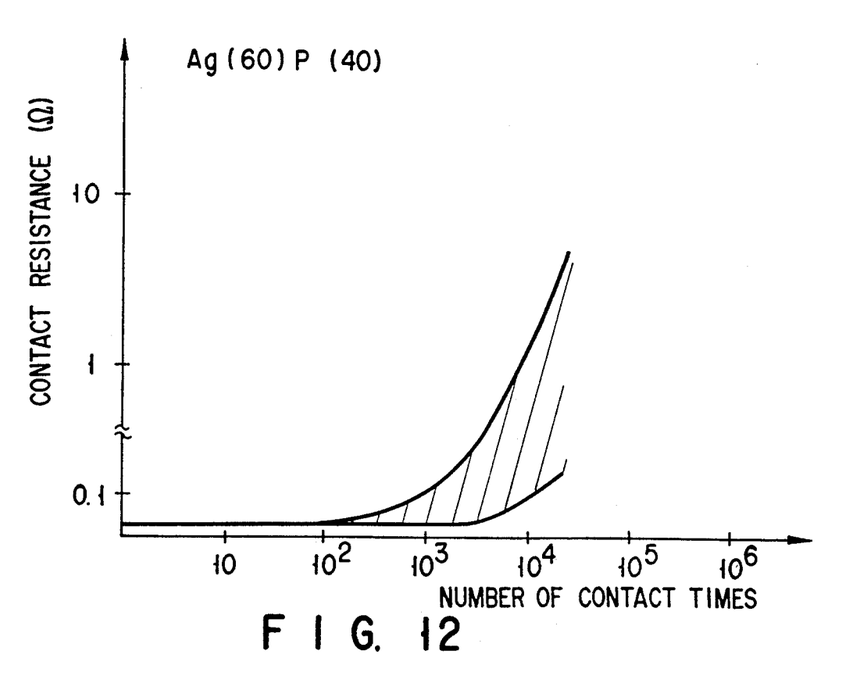

Data as regards variations in the contact resistance of a probe having the following specifications were obtained from a user, and are shown by the graph in FIG. 12. Note that the probe card shown in FIG. 5B was employed in this case.

A probe having the following specifications was prepared:
Support portion 3:
Material: Ag(60)Pd(40); Diameter: 250 μm
Contact portion 2:
Material: Ad(60)Pd(40)
Shape of the tip end portion: circular cone having an apex angle of approx. 3.5° (diameter of the tip: 40–50 μm)

As is seen from FIG. 12, the contact resistance of the probe conspicuously increases after the contact is repeated $10^2$–$10^3$ times. Consequently, for example, users must polish the tip portions of probes, and hence the maintenance thereof is troublesome, resulting in many complaints among the users.

REFERENCE EXAMPLE 5

A probe having the following specifications was prepared:

Support portion 3:

Material: Tungsten; Diameter: 70 μm

Contact portion 2:

Material: Tungsten

Shape of the tip end portion: circular cone having an apex angle of approx. 90° (diameter of the tip: 3-5 μm)

Au plating: a Ni under layer of 2 μm + Au plating of 0.2 μm.

Figure 13:
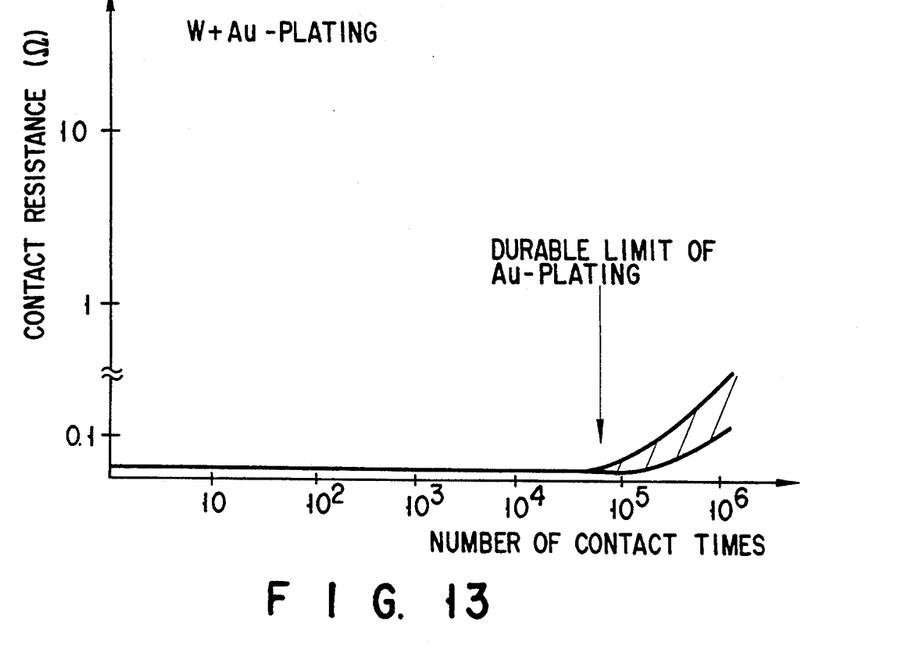

This probe was incorporated in a vertical probe type probe card as shown in FIG. 5A, and a wafer probing test was performed in the same contact manner as the above, employing a sample wafer as used in Example 1. FIG. 13 shows measurement results.

As is evident from FIG. 13, the contact resistance of the probe conspicuously increased after the contact was repeated $10^5$ times, which seems to indicate the limit of the durability of the Au plating.

REFERENCE EXAMPLE 6

Figure 14:
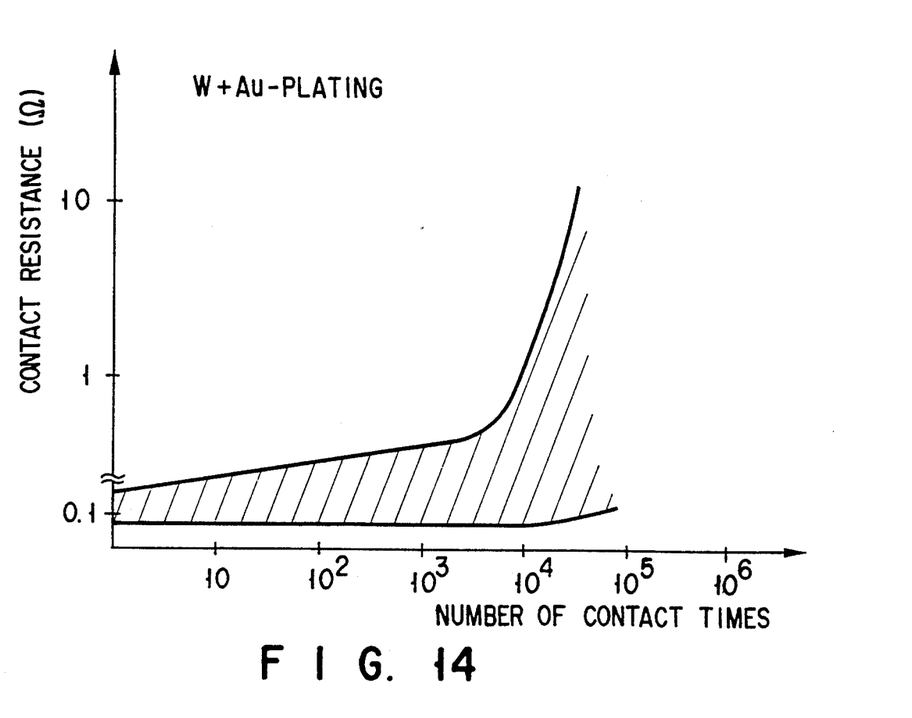

A wafer probing test was performed in the same contact manner as the above, employing a probe as used in Reference Example 5, and a sample wafer as used in Example 2. FIG. 14 shows measurement results.

As is seen from FIG. 14, the contact resistance of the probe conspicuously increased as the number of times the contact was performed increased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A wafer probing apparatus employing a probe card having a probe which corresponds in position to an electrode pad on a semiconductor wafer and which extends perpendicular to a surface of the semiconductor wafer, said wafer probing apparatus measuring electrical characteristics of the semiconductor wafer, with the probe kept in contact with the electrode pad, said wafer probing apparatus comprising:

driving means for driving the semiconductor wafer upward so as to bring the electrode pad into contact with the probe, and for over-driving the semiconductor wafer such that upward movement of the semiconductor wafer continues after initial contact between the electrode pad and the probe, said driving means also sliding the semiconductor wafer in a direction perpendicular to an axis of the probe;

said probe being made of an alloy consisting of 74-76% by weight of Au, 24-26% by weight of Cu, and remaining inevitable impurities and capable of buckling transformation when applied with an overdrive pressure in parallel to said axis; and a supporting member for supporting said probe card to prevent the probe card from bending when the overdrive pressure is applied to said probe.

2. The wafer probing apparatus of claim 1, wherein the inevitable impurities include at least one element selected from the group consisting of Ag, Ni, Fe, C and O, and the content of said inevitable impurities is 0.01% by weight or less.

3. The apparatus of claim 1, wherein said electrode pad is an Al pad.

4. The apparatus of claim 1, wherein said probe card is a vertical probe type probe card.

5. The apparatus of claim 4, wherein the vertical probe type probe card comprises a plate for fixing the probe and a guide plate having a guide hole through which the probe extends.

* * * * *